US006949920B2

United States Patent
Mohri et al.

(10) Patent No.: US 6,949,920 B2
(45) Date of Patent: Sep. 27, 2005

(54) APPARATUS FOR MEASURING CURRENT DENSITY OF FUEL CELL

(75) Inventors: Masahiro Mohri, Utsunomiya (JP); Yosuke Fujii, Tochigi-ken (JP); Katsumi Hayashi, Utsunomiya (JP); Toshiya Wakahoi, Utsunomiya (JP)

(73) Assignee: Honda Motor Co., Ltd., Tokyo (JP)

( * ) Notice: Subject to any disclaimer, the term of this patent is extended or adjusted under 35 U.S.C. 154(b) by 19 days.

(21) Appl. No.: 10/694,505

(22) Filed: Oct. 27, 2003

(65) Prior Publication Data

US 2004/0095127 A1 May 20, 2004

(30) Foreign Application Priority Data

Oct. 28, 2002 (JP) ........................................ 2002-313261

(51) Int. Cl.[7] .............................................. G01R 33/06
(52) U.S. Cl. ................................. 324/117 H; 324/251
(58) Field of Search ................................ 324/244, 246, 324/251–253, 260–263, 439, 444, 117 H, 450; 320/134, 136; 429/90, 92

(56) References Cited

U.S. PATENT DOCUMENTS 6,815,101 B2 * 11/2004 de Vaal et al. ................ 429/13
6,828,055 B2 * 12/2004 Kearl .......................... 429/38

FOREIGN PATENT DOCUMENTS

JP 08-222260 8/1996
JP 09-223512 8/1997

OTHER PUBLICATIONS

Wieser et al, A new technique for two–dimensional current distribution measurements in electrochemical cells, Jul. 2000, Kluwer Academic Publishers, Journal of Applied Electrochemistry, vol. 30: pp. 803–807.*

Noponen et al, Measurement of current distribution in a free–breathing PEMFC, 2002, Elsevier Science, Journal of Power Sources, vol. 106, No. 1–2, pp. 304–312 (Month Unavailable).*

* cited by examiner

Primary Examiner—Vinh Nguyen
Assistant Examiner—Russell M. Kobert
(74) Attorney, Agent, or Firm—Fish & Richardson P.C.

(57) ABSTRACT

A fuel cell system includes a fuel cell. A current density measuring apparatus is provided on a cathode side of the fuel cell. The current density measuring apparatus includes a plurality of Hall elements provided at positions corresponding to measuring positions in an electrode surface. Each of the Hall element is attached to a ferrite core fitted to a pole of a sensor mounting plate. The ferrite core and the Hall element attached to the pole make up a current sensor.

9 Claims, 8 Drawing Sheets

APPARATUS FOR MEASURING CURRENT DENSITY OF FUEL CELL

BACKGROUND OF THE INVENTION

1. Field of the Invention

The present invention relates to an apparatus for measuring current density of a fuel cell. The fuel cell includes an electrolyte electrode assembly, and separators for sandwiching the electrolyte electrode assembly. Each of the electrolyte electrode assemblies includes a pair of electrodes and an electrolyte interposed between the electrodes.

2. Description of the Related Art

For example, a solid polymer electrolyte fuel cell employs a membrane electrode assembly (MEA) which comprises two electrodes (anode and cathode) and an electrolyte membrane interposed between the electrodes. The electrolyte membrane is a polymer ion exchange membrane (proton exchange membrane). The membrane electrode assembly is interposed between separators. The membrane electrode assembly and the separators make up a unit of a fuel cell (unit cell) for generating electricity. Typically, a predetermined number of membrane electrode assemblies and separators are connected together to form a fuel cell stack.

In the fuel cell, a fuel gas such as a hydrogen-containing gas is supplied to the anode. The catalyst of the anode induces a chemical reaction of the fuel gas to split the hydrogen molecule into hydrogen ions (protons) and electrons. The hydrogen ions move toward the cathode through the electrolyte membrane which is appropriately humidified, and the electrons flow through an external circuit to the cathode, creating a DC electric current. An oxygen-containing gas or air is supplied to the cathode. At the cathode, the hydrogen ions from the anode combine with the electrons and oxygen to produce water.

In the fuel cell, a fuel gas flow field (reactant gas flow field) is formed on a surface of the separator facing the anode for supplying the fuel gas to the anode. An oxygen-containing gas flow field (reactant gas flow field) is formed on a surface of the separator facing the cathode for supplying the oxygen-containing gas to the cathode. Further, a coolant flow field is provided between the adjacent separators for supplying a coolant for cooling the fuel cell as necessary.

During power generation, water produced in the chemical reaction is likely to be trapped on the outlet side of the reactant gas flow fields, and the electrolyte membrane may be humidified excessively. If water flooding occurs, reactant gases may not be supplied to the electrode surfaces sufficiently.

In an attempt to address the problem, current density in the electrode surface is monitored for detecting a local current density drop due to flooding. For example, Japanese Laid-Open Patent Publication No. 8-222260, entitled, "ABNORMALITY MONITORING METHOD OF FUEL CELL AND DEVICE THEREOF" discloses an abnormality monitoring method for detecting an abnormal condition of a fuel cell. The abnormal condition is detected by measuring distribution of reducing gas concentration of the fuel gas in the anode surface, or distribution of oxidizing gas concentration of the air in the cathode surface.

Further, Japanese Laid-Open Patent Publication No. 9-223512, entitled, "ABNORMALITY MONITORING METHOD OF FUEL CELL AND DEVICE THEREOF" discloses an abnormality monitoring method for detecting an abnormal condition of a fuel cell. A load current of the fuel cell is changed gradually, and temperature at an arbitrary position in the surface of the base material of the anode, the base material of the cathode, the reactant gas flow field (grooves), or the electrolyte layer is measured. During power generation of the fuel cell, amount of heat energy generated at the arbitrary position is determined based on the relationship between the gradual change of the temperature and the gradual change of the load current to measure density of electric current in the electrode surface. In this manner, the abnormal condition of the fuel cell is detected.

According to the disclosure of Japanese Laid-Open Patent Publication No. 8-222260, a stainless thin tube is connected to a vacuum chamber through a leak control valve. A measuring element of a quadrupole mass spectrometer is provided in the vacuum chamber. The stainless thin tube is inserted in one of fuel gas flow grooves for measuring hydrogen concentration in the fuel gas flow groove. Then, hydrogen concentration in the next fuel gas flow groove is measured by inserting the stainless thin tube in the next fuel gas flow groove. The measuring process is performed repeatedly for measuring hydrogen concentration in each of the fuel gas flow grooves.

In the technique of Japanese Laid-Open Patent Publication No. 8-222260, however, if there are many fuel gas grooves, since it is necessary to insert the stainless thin tube in each of the fuel gas grooves for measuring hydrogen concentration, the abnormality detecting operation is laborious, and time consuming.

In the technique of Japanese Laid-Open Patent Publication No. 9-223512, amount of heat energy generated at the arbitrary position is determined based on the relationship between the gradual change of the temperature and the gradual change of the load current to measure density of electric current in the electrode surface. Thus, it takes considerable time to measure density of electric current in the electrode surface during power generation. The abnormality detecting operation can not be performed efficiently.

SUMMARY OF THE INVENTION

A main object of the present invention is to provide a current density measuring apparatus having a simple structure, in which current density distribution in the electrode surface can be obtained efficiency and reliably.

According to the present invention, a plurality of Hall elements are provided at positions corresponding to measuring positions in the electrode surface. During power generation of the fuel cell, an output voltage measuring mechanism determines current density distribution in the electrode surface based on voltage values outputted from the Hall elements.

During power generation of the fuel cell, electric current flowing the fuel cell generates a magnetic field applied to the Hall elements. A detection signal indicating a voltage value (Hall voltage) is outputted from each of the Hall elements. The Hall voltage is proportional to the electric current during power generation. Based on the voltage values outputted from the Hall elements, current density distribution is determined efficiently and accurately. Thus, for example, flooding in the electrode surface can be detected reliably.

The above and other objects, features and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Figure 1:
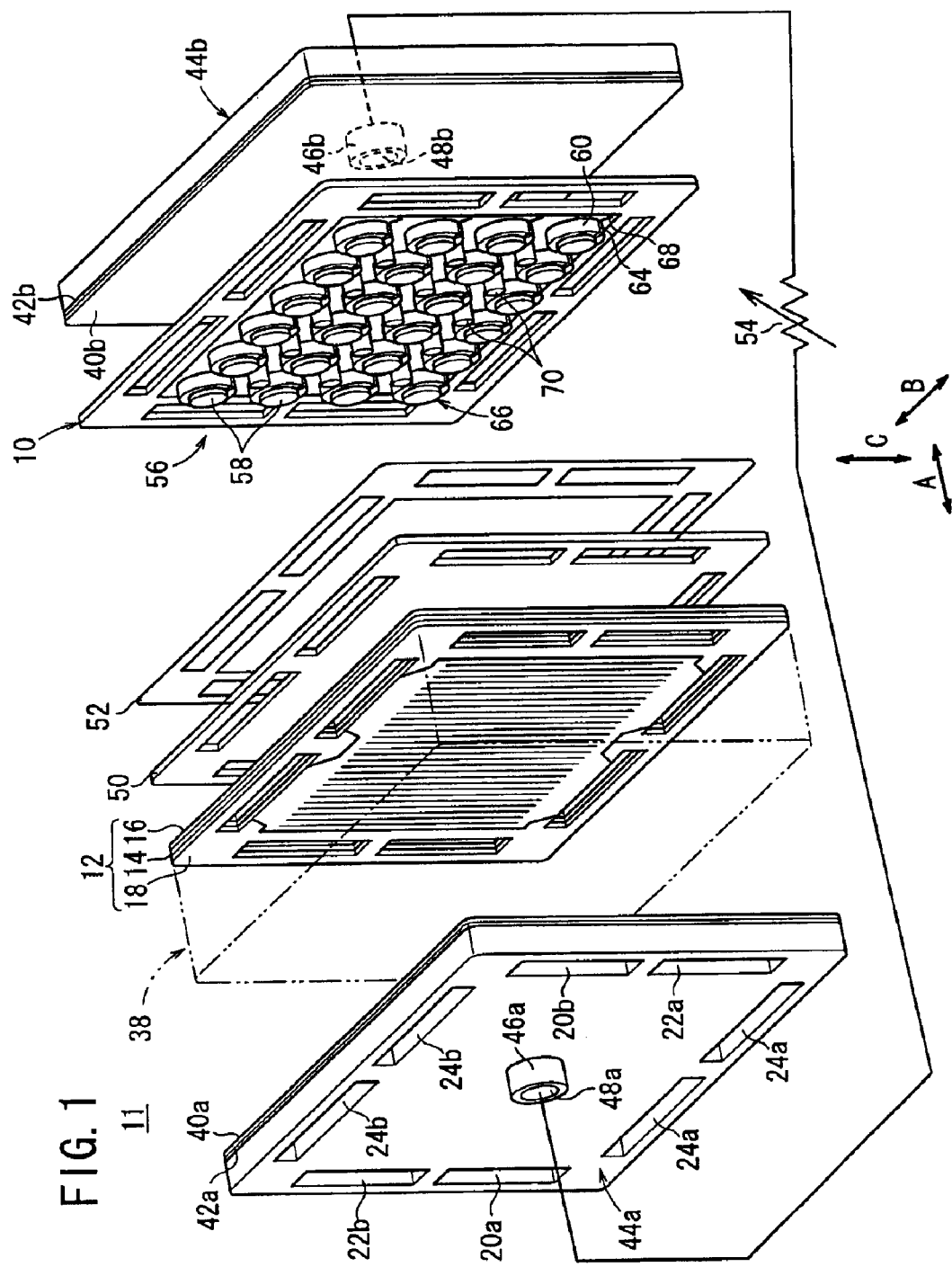
FIG. 1 is an exploded perspective view showing main components of a fuel cell system including a current density measuring apparatus for a fuel cell according to an embodiment of the present invention.
Figure 2:
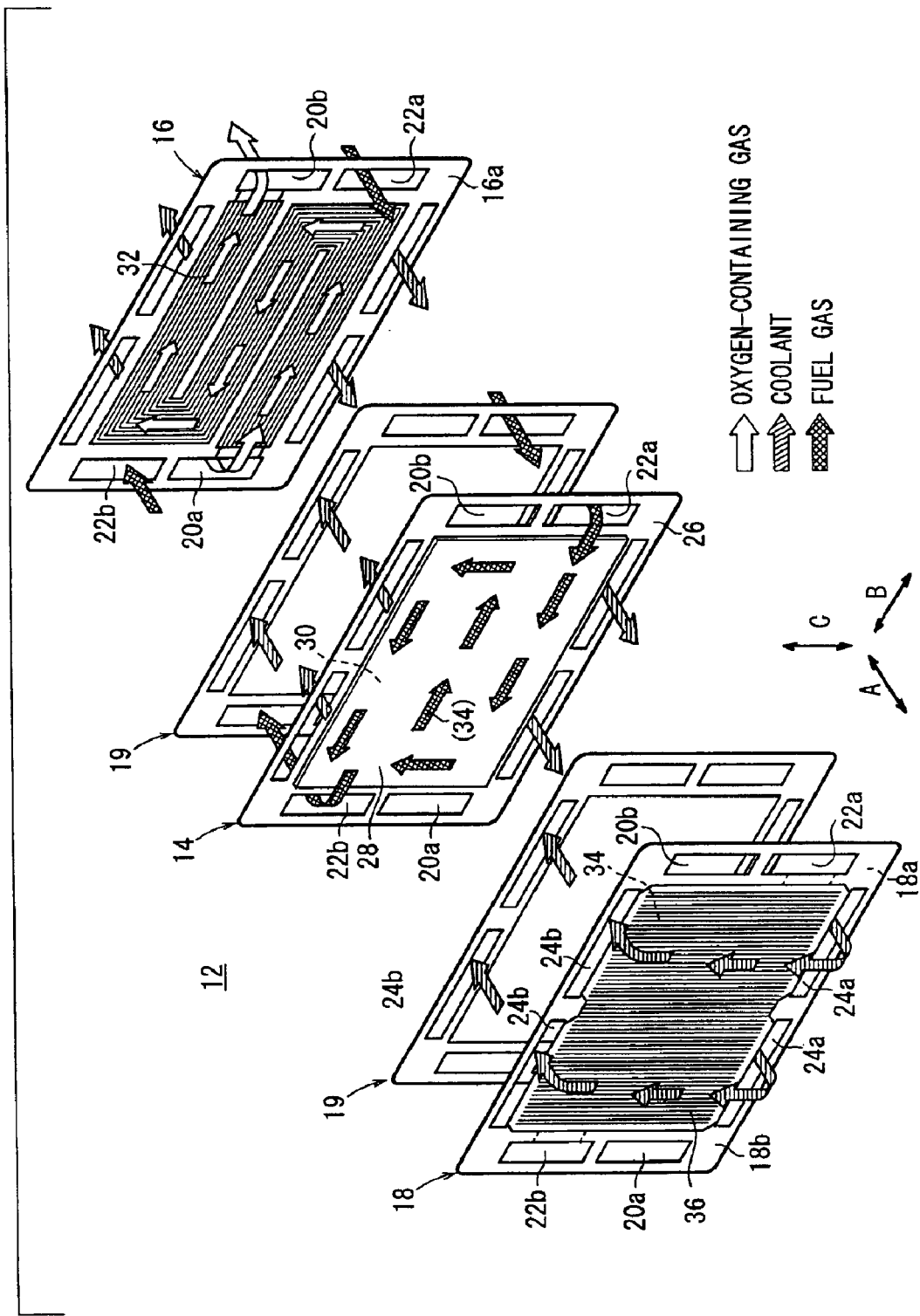
FIG. 2 is an exploded perspective view showing main components of the fuel cell.

FIG. 1 is an exploded perspective view showing main components of a fuel cell system 11 including an apparatus for measuring current density (current density measuring apparatus) 10 according to an embodiment of the present invention. The current density measuring apparatus 10 measures current density of a fuel cell 12. FIG. 2 is an exploded perspective view showing main components of the fuel cell 12.

As shown in FIG. 2, the fuel cell 12 includes a membrane electrode assembly (electrolyte electrode assembly) 14, and first and second separators 16, 18 for sandwiching the membrane electrode assembly 14. Seal members 19 such as a gasket are provided between the membrane electrode assembly 14, and the first and second separators 24, 26 for sealing passages as described later and electrode surfaces (power generating surfaces).

At one end of the fuel cell 12 in a direction indicated by an arrow B, an oxygen-containing gas supply passage 20a for supplying an oxygen-containing gas, and a fuel gas discharge passage 22b for discharging a fuel gas such as a hydrogen-containing gas are formed. The oxygen-containing gas supply passage 20a and the fuel gas supply passage 22b extend through the fuel cell 12 in a stacking direction indicated by an arrow A.

At the other end of the fuel cell 12 in the direction indicated by the arrow B, a fuel gas supply passage 22a for supplying the fuel gas, and an oxygen-containing gas discharge passage 20b for discharging the oxygen-containing gas are formed. The fuel gas supply passage 22a and the oxygen-containing gas discharge passage 20b extend through the fuel cell 12 in the direction indicated by the arrow A.

At a lower end of the fuel cell 12, two coolant supply passages 24a for supplying a coolant such as pure water, an ethylene glycol or an oil are formed. At an upper end of the fuel cell 12, two coolant discharge passages 24b for discharging the coolant are formed.

The membrane electrode assembly 14 comprises an anode 28, a cathode 30, and a solid polymer electrolyte membrane 26 interposed between the anode 28 and the cathode 30. The solid polymer electrolyte membrane (electrolyte) 26 is formed by impregnating a thin membrane of perfluorosulfonic acid with water, for example. Each of the anode 28 and cathode 30 has a gas diffusion layer such as a carbon paper, and an electrode catalyst layer of platinum alloy supported on carbon particles. The carbon particles are deposited uniformly on the surface of the gas diffusion layer. The electrode catalyst layer of the anode 28 and the electrode catalyst layer of the cathode 30 are fixed to both surfaces of the solid polymer electrolyte membrane 26, respectively.

The first separator 16 has an oxygen-containing gas flow field (reactant gas flow field) 32 on its surface 16a facing the cathode 30 of the membrane electrode assembly 14. The oxygen-containing gas flow field 32 is connected to the oxygen-containing gas supply passage 20a at one end, and connected to the oxygen-containing gas discharge passage 20b at the other end. The oxygen-containing gas flow field 32 comprises a plurality of grooves (serpentine grooves) extending in a serpentine pattern for allowing the oxygen-containing gas to flow back and forth in the direction indicated by the arrow B, and flows vertically (upwardly).

The second separator 18 has a fuel gas flow field (reactant gas flow field) 34 on its surface 18a facing the anode 28 of the membrane electrode assembly 14. The fuel gas flow field 34 has a structure similar to the oxygen-containing gas flow field 32. The fuel gas flow field 34 is connected to the fuel gas supply passage 22a at one end, and connected to the fuel gas discharge passage 22b at the other end. The fuel gas flow field 34 comprises a plurality of grooves (serpentine grooves) extending in a serpentine pattern for allowing the fuel gas to flow back and forth in the direction indicated by the arrow B, and flows vertically (upwardly).

Further, the second separator 18 has a straight coolant flow field 36 on its surface 18b opposite to the surface 18a. The coolant flow field 36 is connected to the coolant supply passages 24a at one end, and connected to the coolant discharge passages 24b at the other end. The coolant flow field 36 comprises a plurality of grooves extending in parallel to each other vertically in the direction indicated by the arrow C.

As shown in FIG. 1, the fuel cell system 11 includes a fuel cell stack 38 formed by stacking a plurality of the fuel cells 12. The constituent elements of the fuel cell system 11 that are identical to those of the fuel cell 12 are labeled with the same reference numeral, and description thereof is omitted.

A copper terminal plate 40a, an insulating plate 42a, and a first end plate 44a are stacked on the second separator 18 facing the anode 28. An annular projection 46a protrudes integrally from the insulating plate 42a, and the annular projection 46a extends through a substantially central region of the first end plate 44a. A cylindrical anode terminal 48a protrudes integrally from the terminal plate 40a. The cylindrical anode terminal 48a is inserted into the annular projection 46a.

A carbon terminal 50 is stacked on the first separator 16 facing the cathode 30. An insulating plate 52 is stacked on the carbon terminal 50, and the current density measuring apparatus 10 is stacked on the insulating plate 52.

Further, a copper terminal plate 40b, an insulating palate 42b, and a second end plate 44b are stacked on the current density measuring apparatus 10. An annular projection 46b protrudes integrally from the insulating plate 42b, and the annular projection 46b extends through a substantially central region of the second end plate 44b. A cylindrical cathode terminal 48b protrudes integrally from the terminal plate 40b. The cylindrical cathode terminal 48b is inserted into the annular projection 46b. The anode terminal 48a and the cathode terminal 48b are connected to an external load 54.

Figure 3:
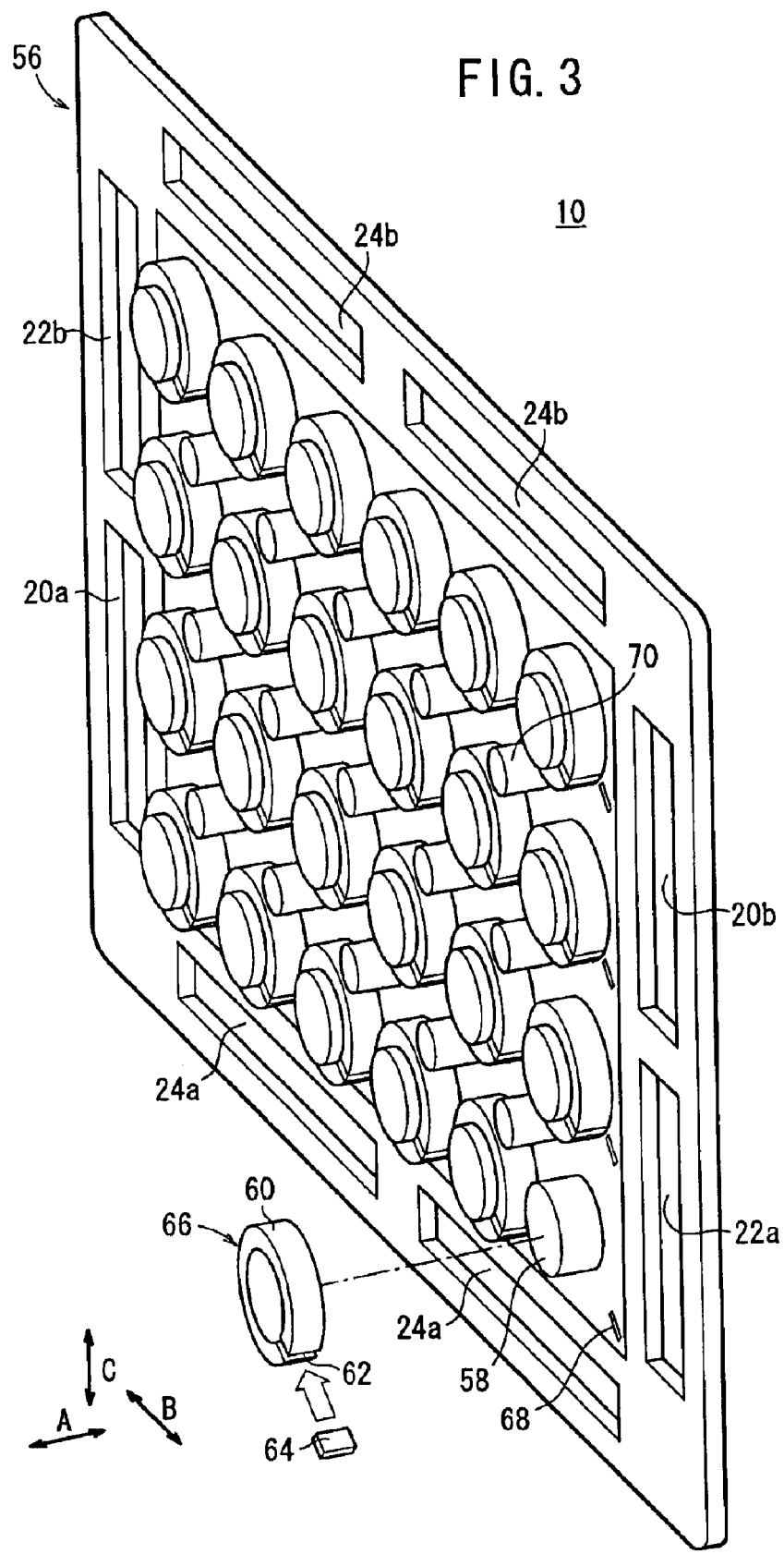
FIG. 3 is an exploded perspective view showing a part of the current density measuring device.
Figure 4:
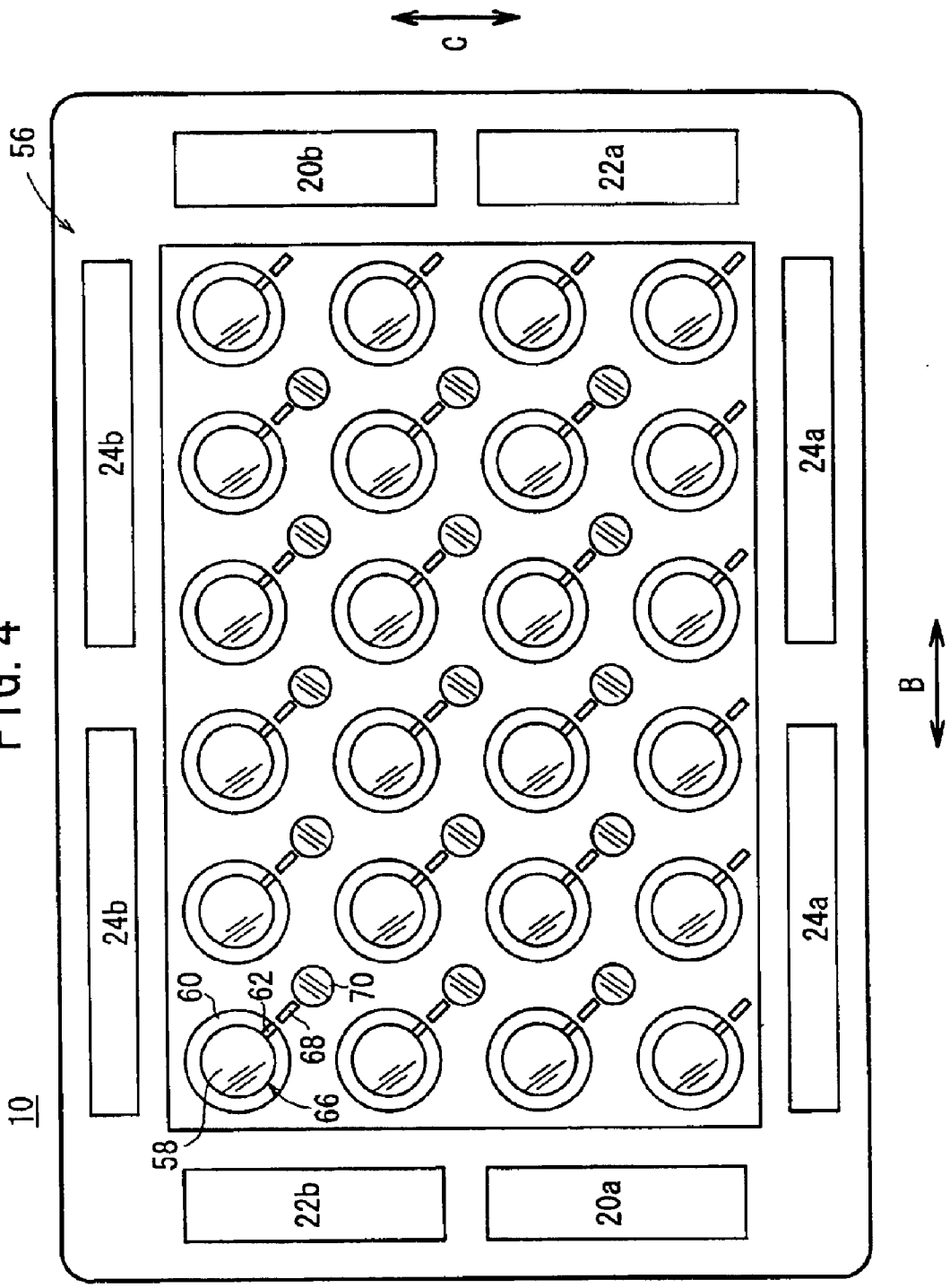
FIG. 4 is a front view showing the current density measuring apparatus.

As shown in FIGS. 3 and 4, the current density measuring apparatus 10 includes a sensor mounting plate 56. The sensor mounting plate 56 is formed by gold plating a copper base material. A plurality of poles 58 protrude integrally from the sensor mounting plate 56 toward the carbon terminal 50. The poles 58 are provided at positions corresponding to measuring positions in the electrode surface. In the illustrated embodiment, 24 poles are arrayed in a 6×4 pattern, i.e., in six columns in the direction indicated by the arrow B, and six rows in the direction indicated by the arrow C. A substantially annular ferrite core 60 is externally fitted to each of the poles 58. The ferrite core 60 has a slit 62 for attaching a Hall element 64. The ferrite core 60 and the Hall element 64 attached to the pole 58 jointly make up a current sensor 66. The sensor mounting plate 56 has indexes 68 adjacent to the poles 58 for positioning the Hall elements 64, respectively. Further, supporting columns 70 are arranged between the current sensors 66. The supporting columns 70 are made of resinous insulating material. The supporting columns 70 ensures that the pressure is applied to the electrode surface uniformly, and enhances rigidity of the current density measuring apparatus 10 for protection against external shocks.

Figure 5:
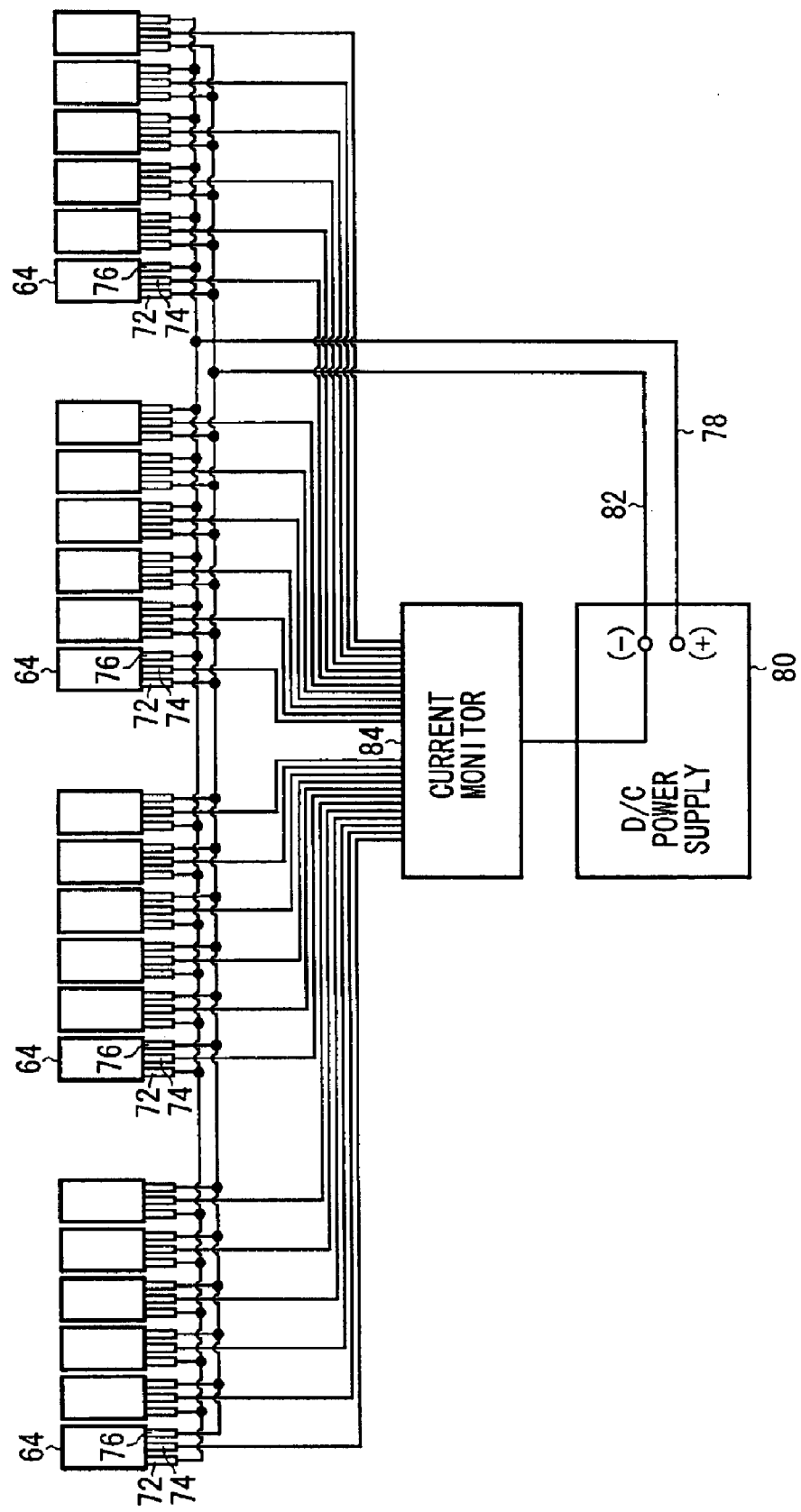
FIG. 5 is a diagram showing a circuit arrangement of the current density measuring apparatus.

As shown in FIG. 5, each of the Hall elements 64 includes a first terminal 72, a second terminal 74, and a third terminal 76. A voltage for driving the Hall element 64 is applied through the first terminal 72. The measured voltage is outputted from the Hall element 64 through the third terminal 76.

The first terminals 72 of the Hall elements 64 are connected to a positive terminal of a D/C power supply 80 through a first common line 78. The third terminals 76 of the Hall elements 64 are connected to a negative terminal of the D/C power supply 80 through a second common line 82. The second terminals 74 of the Hall elements 64 are connected to a current monitor (output voltage measuring mechanism) 84. Current density distribution in the electrode surface is determined by the current monitor 84 based on the voltage values outputted from the second terminals 74 of the Hall elements 64. The current monitor 84 is connected to the negative terminal of the D/C power supply 80.

The lines from the Hall elements 64 may be provided directly on the sensor mounting plate 56. Alternatively, a printed board such as a polyimide film or a glass epoxy board may be formed on the sensor mounting plate 56.

Next, operation of the fuel cell 12 will be described below.

In operation, an oxygen-containing gas such as air, a fuel gas such as a hydrogen-containing gas, and a coolant such as pure water, an ethylene glycol or an oil are supplied into the fuel cell 12. The oxygen-containing gas flows through the oxygen-containing gas supply passage 20a in the direction indicated by the arrow A, and flows into the oxygen-containing gas flow field 32 of the first separator 16. The oxygen-containing gas in the oxygen-containing gas flow field 32 flows back and forth in the direction indicated by the arrow B in a serpentine pattern along the cathode 30 of the membrane electrode assembly 14 to induce a chemical reaction at the cathode 30.

The fuel gas flows through the fuel gas supply passage 22a in the direction indicated by the arrow A, and flows into the fuel gas flow field 34. The fuel gas in the fuel gas flow field 34 flows back and forth in the direction indicated by the arrow B in a serpentine pattern along the anode 28 of the membrane electrode assembly 14 to induce a chemical reaction at the anode 28.

In the membrane electrode assembly 14, the oxygen-containing gas supplied to the cathode 30, and the fuel gas supplied to the anode 28 are consumed in the electrochemical reactions at catalyst layers of the cathode 30 and the anode 28 for generating electricity.

After the oxygen-containing gas is consumed at the cathode 30, the oxygen-containing gas flows into the oxygen-containing gas discharge passage 20b. Similarly, after the fuel gas is consumed at the anode 28, the fuel gas flows into the fuel gas discharge passage 22b.

The coolant supplied to the coolant supply passages 24a flows from the coolant supply passage 24a into the coolant flow field 36. The coolant flows vertically (upwardly) along the coolant flow field 36 for cooling the membrane electrode assembly 14. After the coolant is used for cooling the membrane electrode assembly 14, the coolant flows into the coolant discharge passages 24b.

Next, operation of the current density measuring device 10 will be described below.

The current sensor 66 of the current density measuring device 10 detects Hall voltage $V_H$ using the Hall effect. The Hall voltage $V_H$ is converted into a current value according to a calibration curve ($I \propto V_H$) generated based on known current values. In this manner, electric current I generated during power generation is measured at each of the measuring positions.

Figure 6:
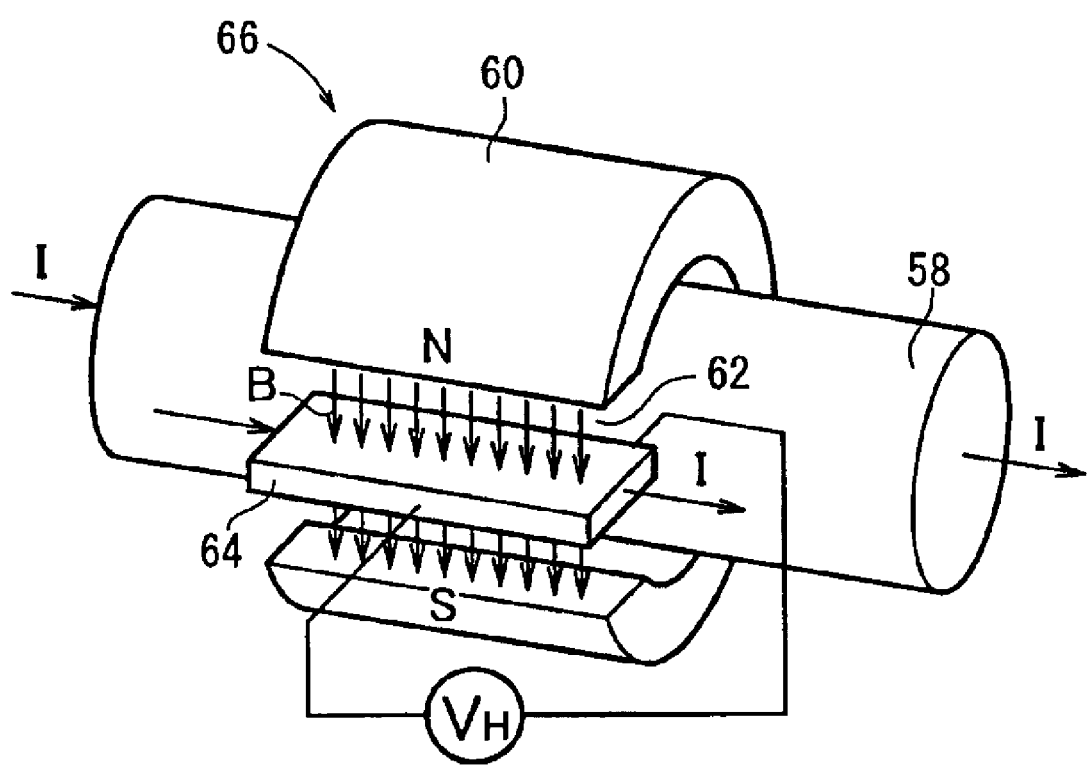
FIG. 6 is a view showing a Hall element used in the current density measuring apparatus.

When the electric current I flows through the pole 58 as shown in FIG. 6, the ferrite core 60 generates a magnetic field around the Hall element 64. The electric current I flows through the Hall element 64. The Hall voltage $V_H$ is generated in a direction perpendicular to the flow direction of the electric current I, and perpendicular to the direction of the magnetic flux density B in the magnetic field.

The electric current I is proportional to the magnetic flux density B ($I \propto B$), and the magnetic flux density B is proportional to the Hall voltage $V_H$ ($B \propto V_H$). Thus, the electric current I is proportional to the Hall voltage $V_H$ ($I \propto V_H$). The Hall voltage $V_H$ is calculated by the following equation:

$$V_H = B \times \mu H \times W/L \times V_{CONST} (= V_{HM} - V_U)$$

where $V_H$ is the Hall voltage, B is the magnetic flux density, $\mu H$ is the electron mobility, $V_{CONST}$ is the voltage for driving the Hall element, W is the width of a sensing element, L is the length of the sensing element, $V_{HM}$ is the measured voltage, and $V_U$ is the unbalance voltage.

According to the embodiment of the present invention, during power generation of the fuel cell 12, the plurality of (e.g., 24) electric current sensors 66 each having the Hall element 64 are operated to detect the Hall voltage $V_H$ at each of the measuring positions. The Hall voltage $V_H$ is generated when the electric current I flows from the cathode 30 of the fuel cell 12. A detection signal indicating the Hall voltage $V_H$ is outputted to the current monitor 84. In this manner, the value of the electric current during power generation (electric current I) is measured at each of the measuring positions.

Figure 7:
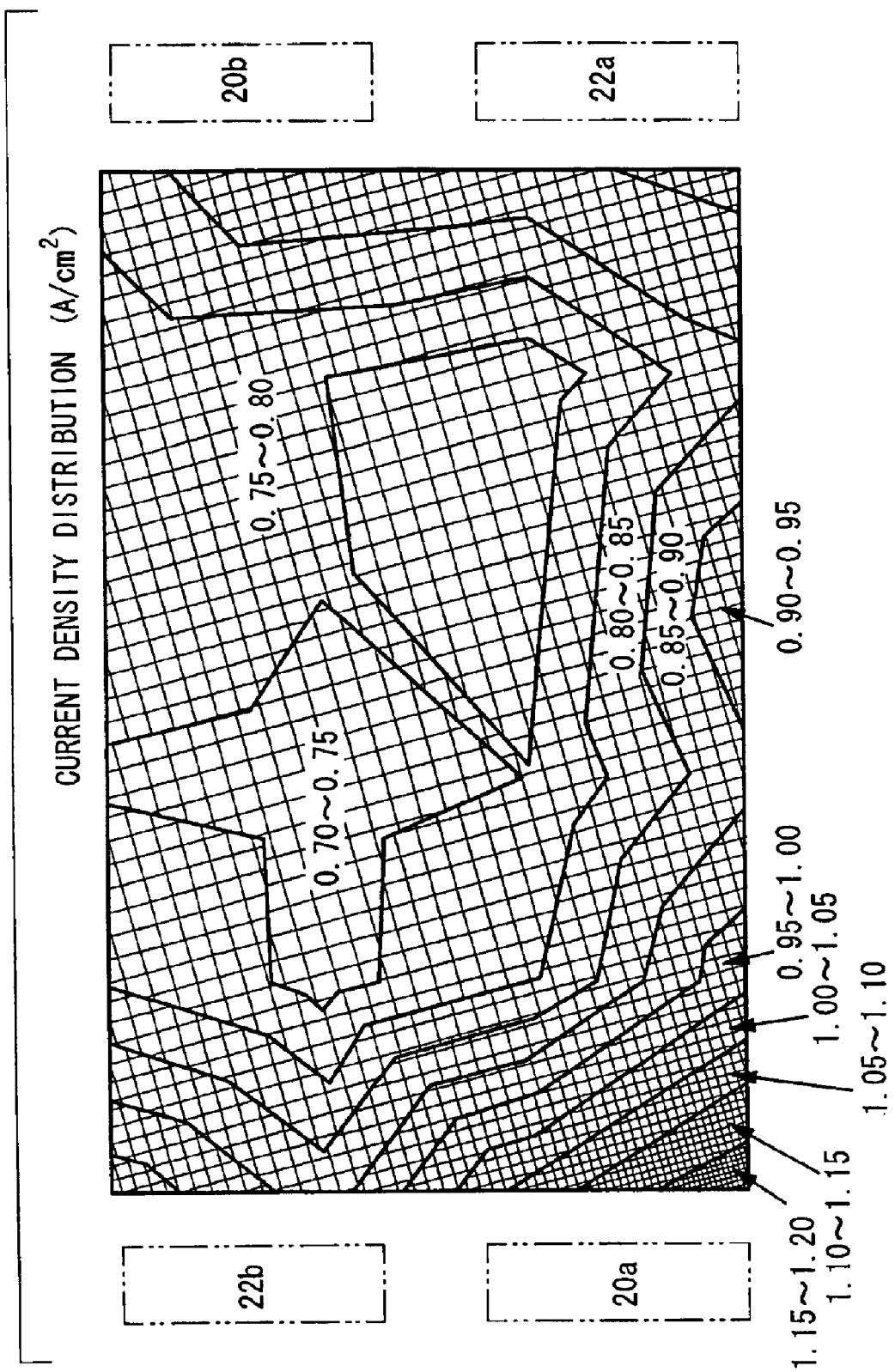
FIG. 7 is a diagram showing current density distribution in an electrode surface immediately after electric current detection by the current density measuring apparatus.
Figure 8:
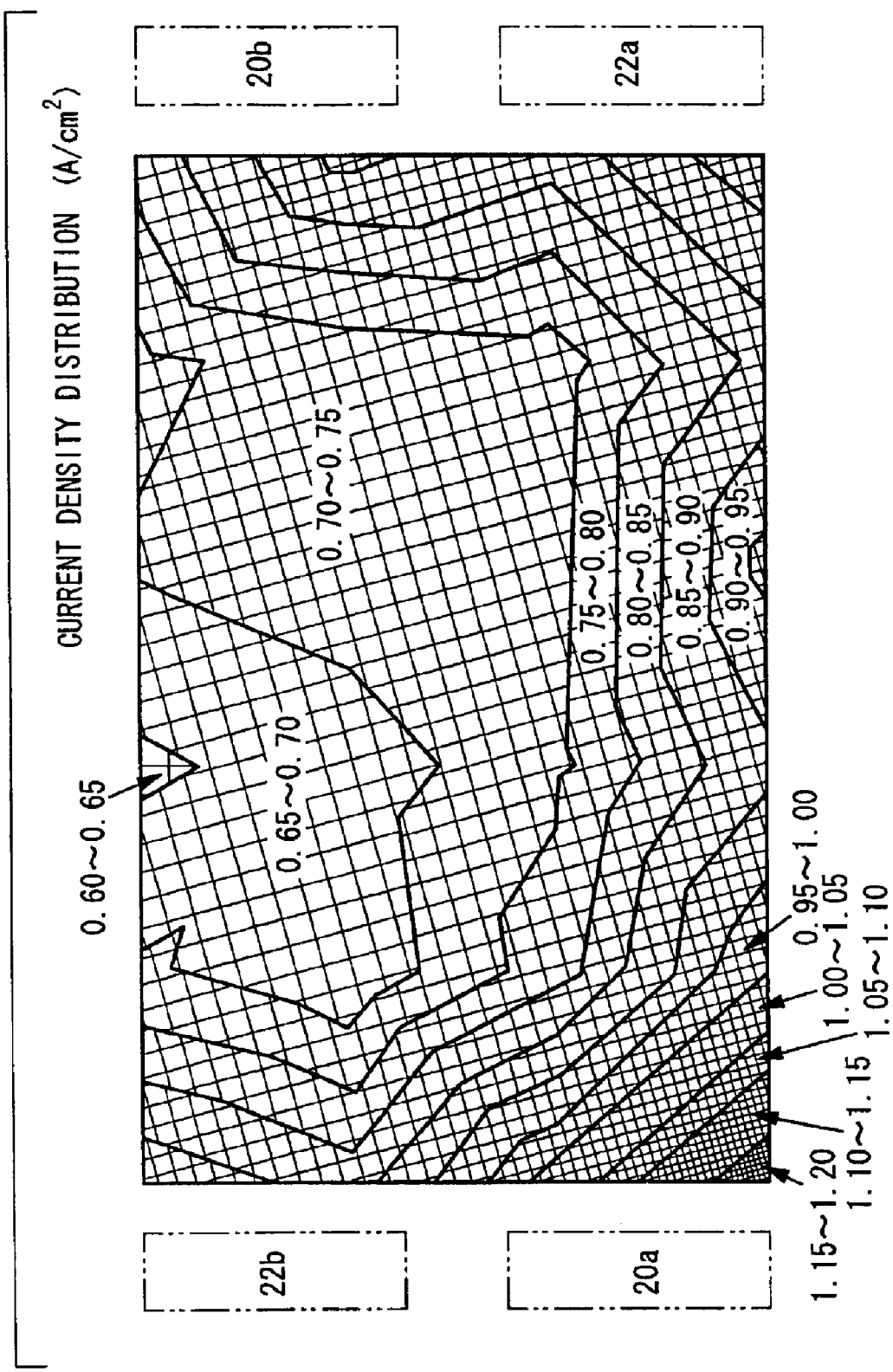
FIG. 8 is a diagram showing current density distribution in the electrode surface ten minutes after the condition shown in FIG. 7.

FIG. 7 is a diagram showing current density distribution ($A/CM_2$) in an electrode surface immediately after electric current detection by the current density measuring apparatus 10. FIG. 8 is a diagram showing current density distribution ($A/CM_2$) in the electrode surface ten minutes after the condition shown in FIG. 7.

With the use of the electric current sensors 66 each having the Hall element 64, current density distribution in the electrode surface can be obtained efficiently based on the voltage values outputted from the current sensors 66. Thus, flooding in the electrode surface can be detected reliably, and the power generating condition of the fuel cell 12 can be monitored easily.

According to the embodiment of the present invention, the fuel cell system 11 may include the fuel cell stack 38 formed by stacking a plurality of the fuel cells 12. Current density distribution can be obtained for each of the power generating surfaces in the entire fuel cell stack 38. Thus, flooding or other undesirable conditions can be detected easily and reliably.

In the current density measuring device for the fuel cell according to the present invention, when electric current flows during power generation of the fuel cell, the electric current induces a magnetic field applied to the plurality of the Hall elements provided at the positions corresponding to the measuring positions of in the electrode surface. Based on the voltage values outputted from the Hall elements, current density distribution in the electrode surface is obtained. Thus, flooding in the electrode surface can be obtained reliably.

While the invention has been particularly shown and described with reference to preferred embodiments, it will be understood that variations and modifications can be effected thereto by those skilled in the art without departing from the spirit and scope of the invention as defined by the appended claims.

What is claimed is:

1. A current density measuring apparatus for measuring current density in an electrode surface of a fuel cell, said fuel cell including an electrolyte electrode assembly and separators for sandwiching said electrolyte electrode assembly, said electrolyte electrode assembly including a pair of electrodes and an electrolyte interposed between said electrodes, said current density measuring apparatus comprising:

a plurality of Hall elements provided at positions corresponding to measuring positions in said electrode surface; and an output voltage measuring mechanism for measuring voltage values outputted from said Hall elements during power generation of said fuel cell, wherein said Hall elements are provided on a single electrically conductive sensor mounting plate, and current density distribution in said electrode surface is determined based on said voltage values measured by said output voltage measuring mechanism.

2. A current density measuring apparatus according to claim 1, wherein said sensor mounting plate has a plurality of poles provided at positions corresponding to said measuring positions in said electrode surface, and wherein a current sensor is attached to each of said poles.

3. A current density measuring apparatus according to claim 2, wherein said current sensor includes said Hall element and a substantially annular ferrite core having a slit; and said ferrite core is externally fitted to said pole, and said Hall element is attached to said slit of said ferrite core.

4. A current density measuring apparatus according to claim 1, wherein said sensor mounting plate is provided on a cathode side of said fuel cell.

5. A current density measuring apparatus according to claim 1, wherein said output voltage measuring mechanism is connected to each of said Hall elements, and includes a current monitor for determining current density distribution in said electrode surface based on said voltage values outputted from said Hall elements.

6. A current density measuring apparatus according to claim 1, wherein said sensor mounting plate is substantially the same size as said separators.

7. A current density measuring apparatus according to claim 1, wherein said fuel cell further comprises end plates, and wherein said sensor mounting plate and said separators are positioned between said end plates.

8. A current density measuring apparatus according to claim 1, further comprising a plurality of supporting columns, each supporting column positioned adjacent an associated one of said Hall elements on said sensor mounting plate.

9. A current density measuring apparatus according to claim 1, wherein said separators comprise gas flow field grooves.

* * * * *